(12) United States Patent
Shepard (10) Patent No.: US 6,586,327 B2
(45) Date of Patent: Jul. 1, 2003

(54) FABRICATION OF SEMICONDUCTOR DEVICES

(75) Inventor: Daniel R. Shepard, North Hampton, NH (US)

(73) Assignee: NUP2 Incorporated, North Hampton, NH (US)

(*) Notice: Subject to any disclaimer, the term of this patent is extended or adjusted under 35 U.S.C. 154(b) by 0 days.

(21) Appl. No.: 09/965,622

(22) Filed: Sep. 27, 2001

(65) Prior Publication Data
US 2002/0086542 A1 Jul. 4, 2002

Related U.S. Application Data
(60) Provisional application No. 60/235,853, filed on Sep. 27, 2000.

(51) Int. Cl.[7] .................. H01L 21/4763; H01L 21/00
(52) U.S. Cl. .................. 438/626; 438/629; 438/640; 438/43
(58) Field of Search .................. 438/43, 618, 598, 438/599, 625, 626, 629, 640, 675, 638

(56) References Cited

U.S. PATENT DOCUMENTS

| | | | |
|---|---|---|---|
| 3,245,051 A | | 4/1966 | Robb |
| 3,683,722 A | * | 8/1972 | Pears .................. 76/107 |
| 4,369,564 A | * | 1/1983 | Hiltpold .................. 29/571 |
| 5,244,837 A | | 9/1993 | Dennison .................. 437/195 |
| 5,673,218 A | | 9/1997 | Shepard .................. 365/105 |
| 5,834,324 A | | 11/1998 | Nakamoto .................. 438/20 |
| 5,859,964 A | | 1/1999 | Galtier et al. .............. 356/28.5 |
| 6,117,720 A | | 9/2000 | Harshfield .................. 438/238 |
| 6,118,135 A | | 9/2000 | Gonzalez et al. .............. 257/3 |
| 6,268,280 B1 | | 7/2001 | Kohyama .................. 438/629 |
| 6,274,497 B1 | * | 8/2001 | Lou .................. 438/687 |
| 6,309,580 B1 | * | 10/2001 | Chou .................. 264/338 |
| 6,190,929 B1 | * | 2/2002 | Wang et al. .................. 438/20 |
| 2002/0042027 A1 | * | 4/2002 | Chou et al. .................. 430/322 |

FOREIGN PATENT DOCUMENTS

| | | |
|---|---|---|
| EP | 07066438 | 3/1995 |
| EP | 11305055 | 11/1999 |

OTHER PUBLICATIONS

Copy of International Search Report for PCT/US01/30296 (4 pgs.).
"Aries Process Notes: Oxide Planarization", Materials Research Corporation, 2 pages.
Chip Scale Review Online, http://www.chipscalereview.com/issues/0301/techReport.html, printed on Sep. 17, 2001, 3 pages.
Damascene, http://courses.nus.edu.sg/course/phyweets/Projects99/Copper/damascene.htm, printed on Sep. 26, 2001, 8 pages.
Dual–Damascene: Overcoming Process Issues—SI Jun. 2000, http://www.semiconductor.net/semiconductor/issues/2000/200006/six0006dual.asp, printed on Sep. 17, 2001, 7 pages.
Semiconductor International—Aug. 1998, http://semiconductor.net/semiconductor/issues/Issues/1998/aug98/docs/wafer.asp, printed on Sep. 17, 2001, 3 pages.

* cited by examiner

*Primary Examiner*—John F. Niebling
*Assistant Examiner*—Viktor Simkovic
(74) *Attorney, Agent, or Firm*—Testa, Hurwitz & Thibeault, LLP.

(57) ABSTRACT

Fabrication of microelectronic devices is accomplished using a substrate having a recessed pattern. In one approach, a master form is used to replicate a substrate having a pit pattern. In another approach, the substrate is produced by etching. A series of stacked layers having desired electrical characteristics is applied to the substrate and planarized in a manner that creates electrical devices and connections therebetween. The microelectronic devices can include a series of row and columns and are used to store data at their intersection.

31 Claims, 8 Drawing Sheets

FABRICATION OF SEMICONDUCTOR DEVICES

CROSS-REFERENCE TO RELATED APPLICATIONS

This application claims the benefits of United States Provisional Application No. 60/235,853, filed on Sep. 27, 2000, the entire disclosure of which is hereby incorporated by reference.

FIELD OF THE INVENTION

The invention relates to microelectronic devices and there fabrication.

BACKGROUND OF THE INVENTION

A substantial portion of the cost of microelectronic device fabrication is attributable to the capital cost of lithography equipment. Such equipment produces integrated circuits by drawing patterns on a substrate using commonly known methods, such as photolithography, e-beam lithography, as well as many others. Photolithography requires the use of expensive patterned masks. Exposure of the substrate to UV radiation through the mask pattern, followed by etching, forms circuit traces on the substrate. A microscopic electronic device is formed through repetition of this elaborate process so as to generate a series of adjacent stacked circuit layers. The cost of fabrication increases as the device geometry becomes more complex and the feature size diminishes. For features smaller than 1 $\mu$m, e-beam lithography may be needed to create the masks, and deep UV (X-ray) exposure systems may be necessary to perform the substrate lithography. With e-beam lithography, an electron beam is used to draw the features on the surface of the substrate of the masks. This process is very slow because the features are typically drawn sequentially by a single electron beam. Furthermore, multiple lithography steps must be aligned to one another for the resulting device to be operational.

Another method of microelectronic device fabrication is the "dual-damascene" process. Basically, this technique involves etching a trench in a substrate, etching a deeper channel (i.e., a via) within the trench, electrochemically plating an active layer within the trench and the via, and removing the overfill by chemical mechanical polishing (CMP). Currently, only a single material layer (i.e., copper and, possibly, a barrier and/or sticking layer) is plated within the etched trench and via. As a result, this process is limited in terms of the circuitry it can be used to create. Furthermore, the trenches and vias are patterned photolithographically.

Accordingly, there exists a need for a microelectronic device fabrication process that does not use masks or lithography and is not limited to a single material layer.

SUMMARY OF THE INVENTION

The present invention is directed to a microelectronic device fabrication process which, in some embodiments, does not require the use of masks or lithography. This is accomplished through creation of a recessed pattern on a substrate. A series of layers is applied to the substrate surface and the recessed surfaces, and the substrate surface may then be planarized (e.g., by polishing) to a desired degree. Planarization removes one or more of the deposited layers, or a portion of a layer, from the substrate surface but not from within the recessed pattern. Consequently, the depth of a recessed feature determines the number of layers that will remain therein at the conclusion of processing.

In one aspect, therefore, the invention is directed to fabricating a microelectronic device on a substrate having a recessed contour pattern. After the pattern is defined (e.g., by molding, as discussed below, or by etching or other conventional processes) a series of layers each having a predetermined electrical property is applied. The device is planarized (e.g., by polishing) to remove one or more layers thus far applied. Planarization does not affect deposited material within the recessed pattern. The devices is further processed, typically by etching, to further remove material from one or more layers thus far applied and exposed through planarization. Ultimately, the stacked layers are disposed within the contour pattern, and some of the layers also reside on the substrate. The layers cooperate to form the microelectronic device.

In another aspect, the invention relates to fabrication of an electronic devices using a molded substrate. This approach avoids the need to etch a microscopic pattern into the substrate. In accordance with this aspect of the invention, a form having a raised topology complementary to a desired microscopic pattern of features is created. The form is applied to a moldable substrate to impose the pattern therein, i.e., to create a recessed pattern complementary to the raised topology. A series of layers having desired electrical properties is applied to the recessed pattern, thereby creating the electronic device. In one embodiment, the form is fabricated by etching a pattern into a master substrate, plating the patterned master substrate, and electroforming on a metal plate a topology complementary to the etched pattern to serve as a form. The form may be used to impose the original pattern onto a moldable substrate by, e.g., injection molding. The pattern may, for example, comprise pyramidal, square and/or round pits and square, rounded and/or V-groove channels.

In one exemplary embodiment, the invention is used to fabricate a memory device in accordance with any of U.S. Pat. Nos. 3,245,051, 5,673,218 and 5,889,694. In this case, the recessed pattern includes a first series of channels running in a first direction and a second series of channels running in a second direction substantially perpendicular to the first direction. These are imposed (e.g., by molding, as discussed above) into a non-conducting substrate. The first-series channels and the second-series channels cross at crossing points, and pits are located at the crossing points. The applied layers form nonlinear elements (e.g., diodes) in some of the pits, depending on their depths. Each nonlinear element connects a first-series channel with a second-series channel. The nonlinear elements are distributed among the pits in a scheme that defines the data contents of the memory. A connection between crossing channels signifies one binary bit state (e.g., zero) and no connection signifies the other binary bit state (e.g., one).

BRIEF DESCRIPTION OF THE DRAWINGS

The invention is pointed out with particularity in the appended claims. The advantages of the invention may be better understood by referring to the following description taken in conjunction with the accompanying drawing in which:

DETAILED DESCRIPTION OF THE PREFERRED EMBODIMENTS

Figure 1:
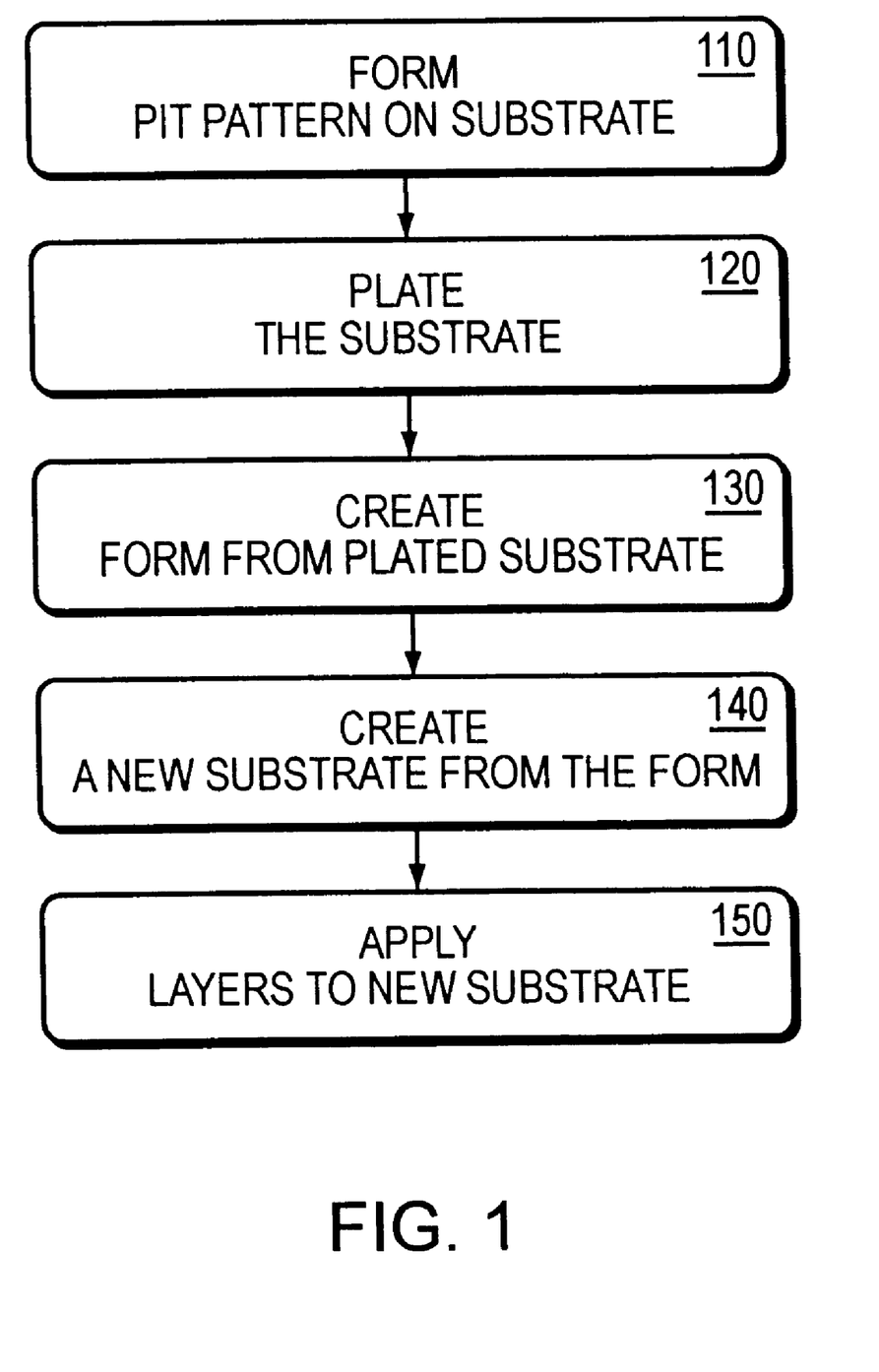
FIG. 1 is a flow chart of an embodiment of a method of the present invention.

Devices in accordance with the invention may be fabricated using a molding process, which obviates the need to etch a recessed pattern into each substrate. Such a process is illustrated in FIG. 1. With reference to FIG. 1, a "master" substrate is etched with the recessed pattern (step 110). This master substrate is then plated (e.g., nickel sputtered) (step 120) in a manner similar to conventional CD and DVD fabrication. The metal-plated master is electroformed to create a form having a raised topology complementary to the recessed pattern of the substrate (step 130). Electroforming is the process of replicating the surface of a master by plating directly over it. A plating material is applied until the desired thickness is achieved. The remaining cavity block is back-filled for strength and then mounted in a frame. In other words, the recesses become raised features. Variations on the electroforming of the master copy could include depositing on that master copy material intended to appear in the face of the mold, following which the mold is chemically or physically separated from the master following deposition.

The form, thus fabricated, is used to create a new substrate from a moldable material (step 140). In one embodiment, injection molding is used to produce new substrates having the same recessed pattern as the master. The new substrate is typically formed out of plastic or glass although other moldable materials (typically, although not necessarily, electrically nonconductive) are suitable. Finally, a series of layers is applied to the new substrate (step 150). These layers provide the desired electrical properties of the microelectronic device.

Figure 2A:
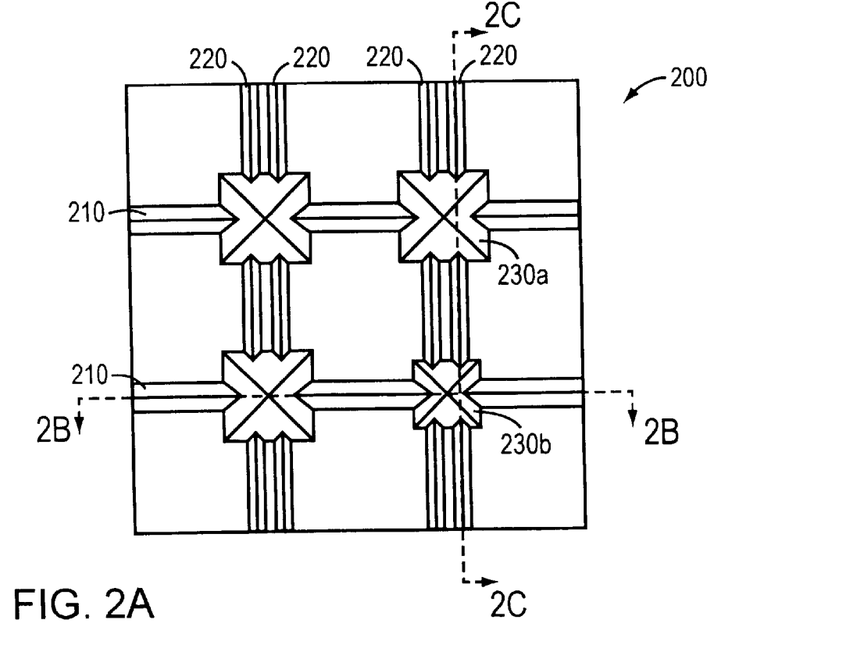
FIG. 2A is a top view of a contoured substrate surface constructed in accordance with the invention.

FIG. 2A is a top view of a portion of a substrate 200 having a microscopic recessed pattern constructed in accordance with the present invention. Typically, feature sizes will range from hundreds of nanometers to microns, but larger and smaller features are possible in accordance with the invention. Substrate 200 can be formed from the master by injection molding or itself could be the master used to create the form; alternatively, the etched substrate can itself be used as the basis for a microelectronic device. The following discussion describes formation of a representative portion of a microelectronic device in which conductive pathways either establish connections to adjacent pathways through nonlinear devices (such as diodes, transistors, etc.) or do not establish connections. A series of rows 210 and columns 220 is etched into substrate 200. Generally, rows 210 and columns 220 are substantially perpendicular to each other and intersect at a matrix of pits 230 having varying depths. The depths of pits 230 are determined by the sizes (i.e., the areas) of the squares defining the tops of the pits 230 at the substrate surface. By selecting different square sizes, one can select an equal number of depths for the resulting pyramidal pits. The formation of such structures is well known to those versed in the art of semiconductor and MEMS fabrication.

In one embodiment, rows 210 and columns 220 are formed using a silicon etch in KOH. The result of the etching process is a plurality of large pits 230a and small pits 230b, referred to generally as pits 230. In one embodiment, pits 230 are pyramidal in shape, and rows 210 and columns 220 are V-grooves, although other shapes are possible. In one specific embodiment, an etch rate of KOH at a concentration of 44 gm in 100 ml $H_2O$, at a temperature of 85° C. is 1.4 $\mu$m/min in the <100> crystal direction whereas in the <111> crystal direction it is only about 0.0035 $\mu$m/min. As a result, side walls form that are approximately 54.74° from horizontal and will have an effective etch-stop when pyramidal pits 230 are formed. The desired depths of rows 210 and columns 220 are controlled through the selection of their widths. As illustrated in the figures, to provide increased conductivity, two side-by-side columns 220 can be used that are each one half the width of the rows 210. This results in pairs of columns 220 with approximately the same total area as the rows 210. In this embodiment, rows 210 are approximately twice as deep as columns 220. The depth of a pit 230 determines whether or not a connection is formed between a row and column where they cross.

Figure 2B:
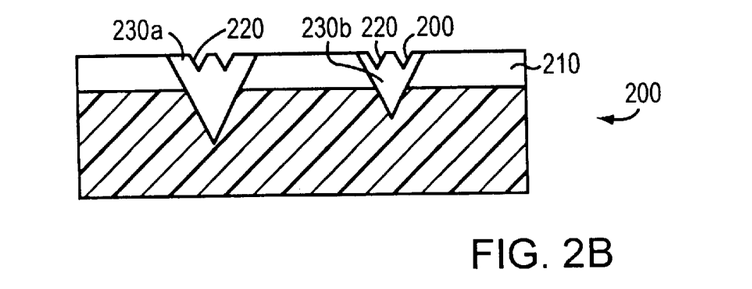
FIG. 2B is a sectional view of the substrate shown in FIG. 2A, taken along line 2B—2B.
Figure 2C:
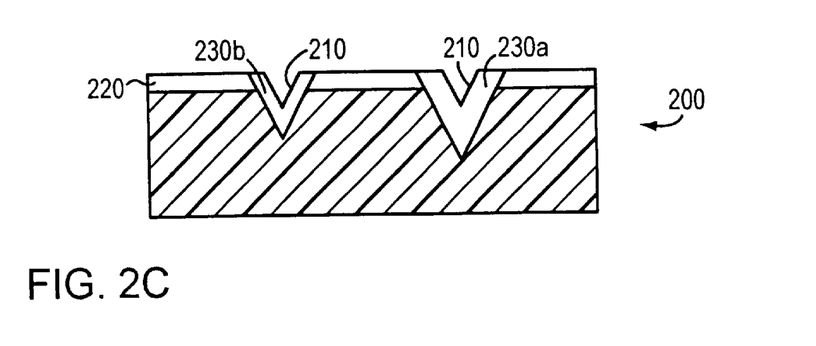
FIG. 2C is another sectional view of the substrate shown in FIG. 2A, taken along line 2C—2C.

The result is shown in the sectional views of FIGS. 2B and 2C. Because the columns 220 and rows 210 are V-grooves, the portion of row 210 visible in FIG. 2B and the portion of column 220 visible in FIG. 2C are receding, i.e., angled into the plane of the figure. Similarly, the visible rear walls of the pits 230 in FIGS. 2B and 2C also recede, and show the entry of a relatively shallow column 220 or a relatively deep row 210 into the pit. The row 210 is nearly as deep as the small pit 230b.

In actual practice, an etch mask for such an array would not look like the final etch pattern as shown in the top view of FIG. 2A. This is because the etch stop for KOH is on a <111> plane that is intact; if the plane is interrupted by another etched surface the etch will continue until an intact <111> surface is reached or the entire silicon area is removed. A circular KOH etch will undercut its mask until a square pyramidal pit is formed. These etch characteristics are discussed in greater detail below.

Actually forming the etch pattern shown in FIG. 2A can be achieved in several ways. One approach is to etch the row 210 and column 220 features with a first KOH etch. The surface is then masked so as to expose only the squares which form the pits 230. The square mask openings should be the size of the pits 230 as they are desired to be at a known distance below the surface. The surface is then etched anisotropically to this depth by an etch which will create vertical side walls (such as an RIE etch). A timed KOH etch is next performed such that the remaining depths are etched in the pits 230. As these remaining depths are etched, the top areas of these square pyramidal pits (the portion above the bottom of the RIE etch) will etch wider than their original RIE etched squared as they seek the <111> plane. By having etched the row 210 and column 220 interconnecting rectangles to slightly overlap the square pits, this etch-back of the top areas of the pits will cause the pits 230 to etch into the ends of the rectangles, thereby forming the desired surface topology. This latter etch is timed such that the interconnects are fully merged with the squares; that is, the connection of an interconnect with a square does not have any shallow seam at the point of connection (as would occur with an under-etch) and also is not so over-etched that the depth of the interconnect is impacted in its middle. Other mask patterns which form both the square pits and the interconnects in a single timed KOH etch are possible. In the case of a KOH etch, the desired depths of the rows 210 and columns 220 can be controlled through the selection of the row and column widths.

The substrate 200 illustrated in FIGS. 2A–2C and described above can be formed on a conventional crystalline silicon wafer. This wafer may be crystalline silicon that is either intrinsic or lightly doped such that the circuits constructed thereon will be electrically isolated from each other by virtue of their being reversed biased with respect to this substrate. Alternatively, the substrate 200 may be processed for the formation of an insulating layer either by oxide growth or by material deposition.

In the case of a silicon substrate, using a KOH etch as described above will form side walls that are approximately 54.74° from horizontal and will have an effective etch stop when pyramidal pits have been formed. If the surface feature is rectangular, the narrower dimension will determine the depth of the pit. If the surface dimension is 1 μm, then a pyramidal feature will be etched that is approximately 7072 Å deep. If an oxide is grown that is 1000 Å thick (which consume approximately 450 Å of the silicon surface and yield a surface to the oxide which is roughly 550 Å above the original silicon surface), then the depth of the resulting pit will be roughly 6120 Å deep measured from the original level of the silicon surface and 6670 Å deep measured from the new oxide surface. This pit will be roughly 8652 Å wide at the original level of the silicon surface and 10,286 Å (1.0286 μm) wide at the surface of the new oxide. If a surface feature of different size is desired, all of these dimensions will scale proportionally.

An additional effect of this geometry is that a layer of material deposited on the wafer can result in a coating that is only 0.5773 times the thickness of the surface deposition if that thickness is measure perpendicular to the wall of the pyramidal pit (i.e., the wall that is 54.74° from the wafer surface), if the material is deposited in a linear deposition process such as e-beam evaporation as opposed to a more conformal deposition process such as sputtering.

While this substrate may be used directly, it is preferred to follow the procedure outlined in FIG. 1 and use the etched substrate as a master. Injection molding, stamping, embossing, and spun-on-glass (SOG) techniques, as well as others, can be used to replicate the microscopic recessed pattern, thereby creating a replicated substrate 200' which is coated with a plurality of material layers to create a microelectronic device. To produce a replicated substrate using SOG techniques, first the electroformed master is coated with SOG which is then delaminated (a releasing agent or a monolayer material to reduce adhesion of the SOG can be spun onto the electroformed master prior to the SOG). Alternatively, a polyimide material could be deposited on the surface of the electroformed master and then delaminated in a way similar to the SOG approach. Some polyimides can be released from a surface by soaking the polyimide coated electroformed master in deionized water (DI water) or, if the electroformed master is coated with a thin layer of silicon dioxide, by soaking the polyimide-coated electroformed master in hydrofluoric acid (HF). Both of these approaches require that the electroformed master not be made of materials that will react with DI or HF, respectively, and such materials are well known to those skilled in the art.

Figure 3:
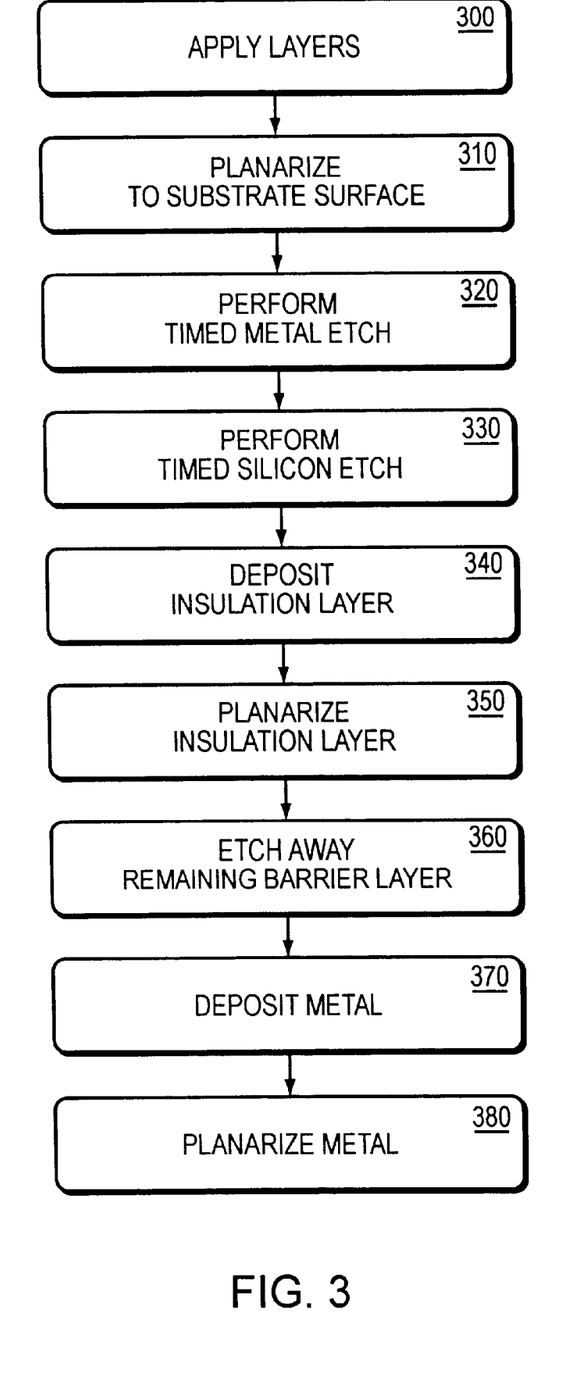
FIG. 3 is a flow chart of an embodiment of the step of applying layers as shown in FIG. 1.

In overview and with reference to FIG. 3, the illustrated series of steps is used to form a memory device in which connections between crossing rows and channels (by means of nonlinear devices) signify one binary state, while the absence of a connection indicates the other state. First a series of layers is applied to the replicated substrate (step 300). Subsequently, the layers are planarized back to the surface of replicated substrate 200' (step 310). Next, a timed metal etch is performed (step 320) followed by a timed silicon etch (step 330). An insulation layer is applied (step 340) and then planarized (step 350). Any barrier material remaining from the original application of the layers and subsequent planarization (steps 300 and 310) is etched away (step 360). Finally, a metal layer is deposited (step 370) and planarized (step 380), creating the memory device.

Figure 4:
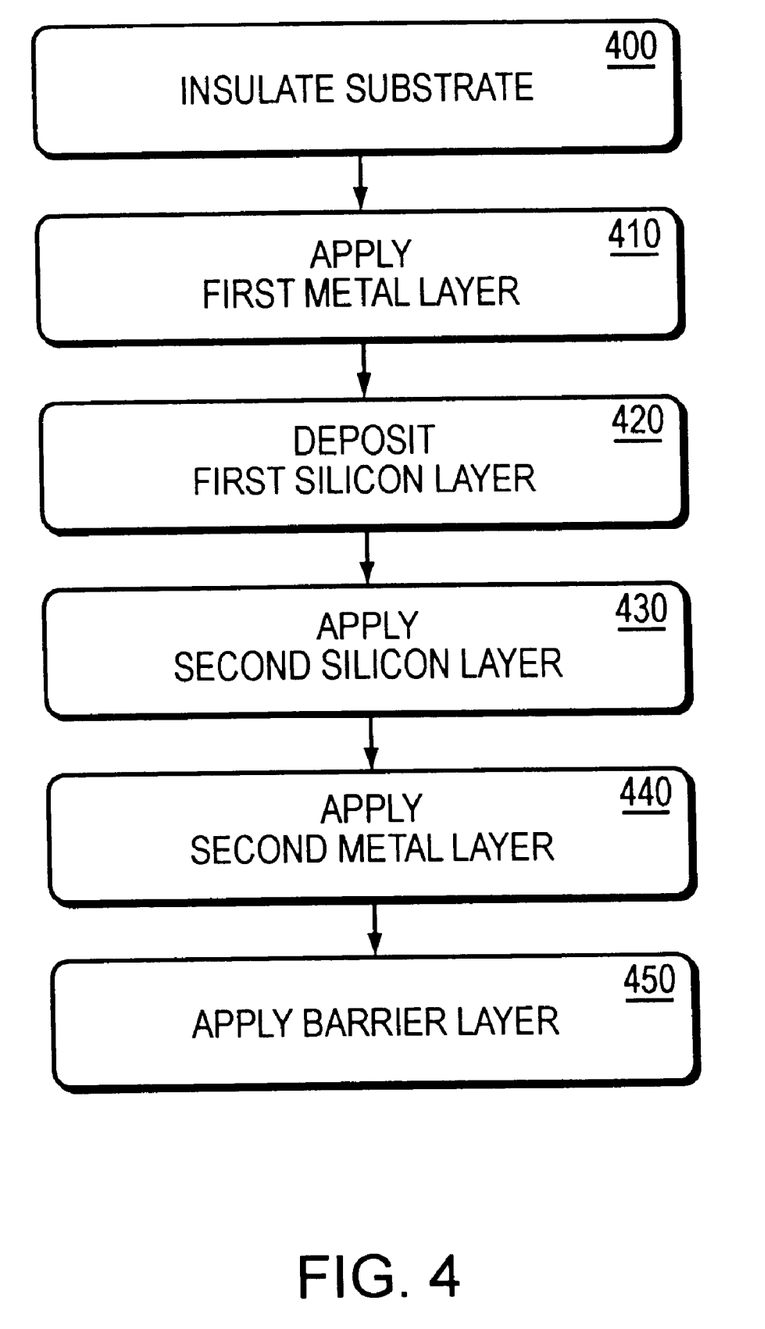
FIG. 4 is a flow chart of an embodiment of the step of the applying the layers of FIG. 3.
Figure 5A:
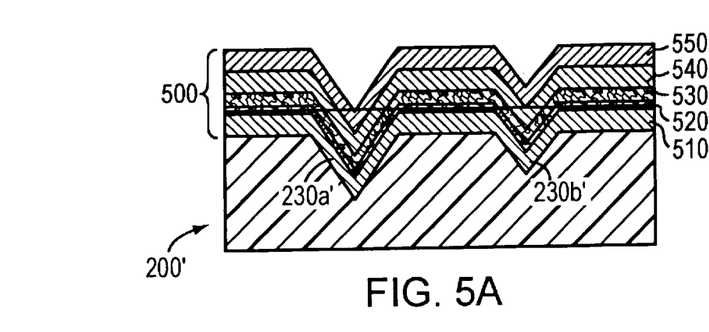
FIG. 5A is a sectional view of the substrate shown in FIG. 2A taken along line 2B—2B, after deposition of the layers.
Figure 5B:
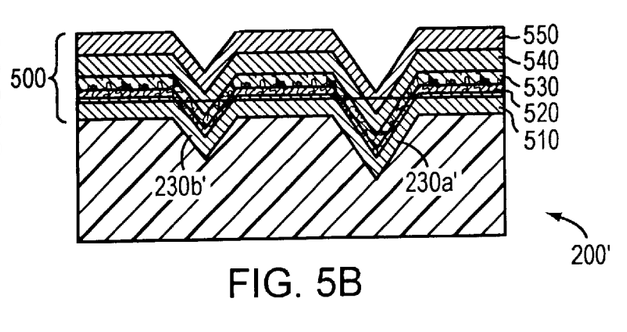
FIG. 5B is a sectional view of the substrate shown in FIG. 2A taken along line 2C—2C, after deposition of the layers.

Deposition of the series of layers collectively indicated at 500 (step 300) is illustrated in more detail in FIG. 4, FIG. 5A, and FIG. 5B. (It should be noted that the ensuing pairs of figures represent the same sections illustrated in FIGS. 2B and 2C.) With reference to those figures, if replicated substrate 200' is not insulative, an insulation layer is applied (step 400, not shown in FIGS. 5A and 5B). In an illustrative embodiment, a 1000 Å bottom metal layer 510 is deposited (step 410) followed by a 250 Å N$^+$ amorphous silicon (N$^+$αSI:H) layer 520 (step 420), a 1000 Å layer 530 of αSI:H (step 430), a 1000 Å top metal layer 540 (step 440), and a barrier layer 550 (step 450), respectively. Bottom metal layer 510 and top metal layer 540 can be tungsten, chromium or molybdenum, and barrier layer 550 can be silicon nitride. The choice of metals for top metal layer 510 and bottom metal layer 540 and their respective thicknesses is not critical to the invention as long as the functional requirements of the device are maintained.

For example, bottom metal layer 510 can be made of any material that will form an ohmic contact with the layer 520 directly above it. Additionally, bottom metal layer 510 should be thick enough to carry an electrical current adequate to provide a desired operational speed with respect to any circuit capacitances. Layer 520 can be any suitable semiconductor that will form an ohmic contact connection between bottom metal layer 510 and the layer 530 directly above it. Layer 520 should be thick enough to prevent bottom metal layer 510 and layer 530 from interacting in a nonlinear way (i.e., a non-rectifying contact). Layer 530 can be any material that will form a rectifying contact with top metal layer 540 (e.g., amorphous silicon, the alpha-T6 material manufactured by Lucent, or organic semiconductor materials including those used to make organic light emitting diodes (oLEDs)). Layer 530 should be thick enough to create an adequate junction depth for proper operation of the rectifying contact. Top metal layer 540 can be any material the will form a rectifying contact with the layer 530 directly below it. In one embodiment, the layers 500 are applied using chemical-vapor deposition (CVD), although other conventional deposition methods are possible.

If squared-off pits are used instead of pyramidal pits, all thicknesses should be thin enough to not create unacceptable aspect ratios (i.e., very tall, thin areas between the rows or columns that are too tall for their widths), given the design feature size, when these layers are etched. Also, certain materials should be avoided, as one skilled in the art of thin-film transistors (TFT) manufacturing will appreciate. For example, the deposition of amorphous silicon will occur at 200 to 400° C. or higher. The metal on which it is deposited should remain stable during deposition so as to not react unfavorably with the deposited silicon. Some metals, such as aluminum, will react continuously with the grain boundaries of the amorphous silicon and are unsuitable even for the top metal unless additional barrier metal is added.

Figure 6A:
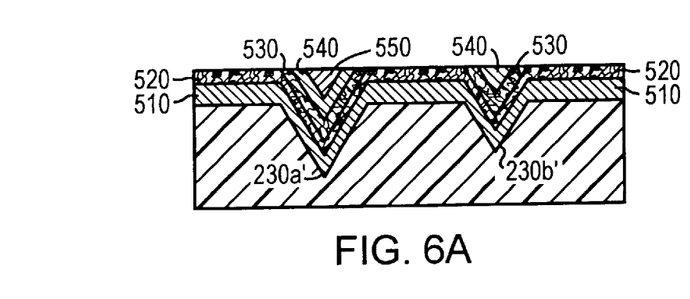
FIG. 6A is a sectional view of the substrate shown in FIG. 2A taken along line 2B—2B, after planarization.
Figure 6B:
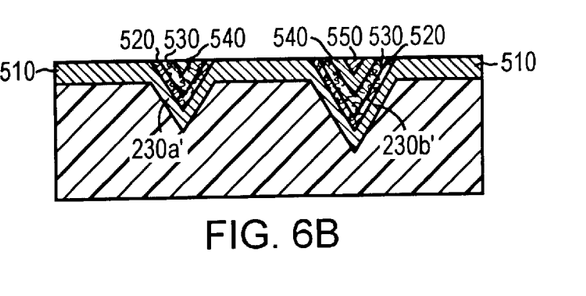
FIG. 6B is a sectional view of the substrate shown in FIG. 2A taken along line 2C—2C, after planarization.

With renewed reference to FIG. 3, once applied, layers 500 are planarized (step 310). FIGS. 6A and 6B show the result of simultaneously planarizing all of the materials to coincide with the height of substrate 200. In an alternate embodiment, this planarization is accomplished with a combination of CMP and etching. With reference to FIG. 6A and FIG. 6B, a CMP polishing step removes barrier layer 550 and top metal layer 540 to the highest point of the amorphous silicon layer 530. Subsequently, a timed etch is performed to reduce the height of the amorphous silicon layer 530 to coincide with the height of substrate 200'. Finally, the CMP polishing step is repeated so as to remove any remaining top metal layer 550 or bottom metal layer 510 above the substrate 200' surface. Alternatively, other planarization methods can be used, for example, oxide planarization wherein an oxide material (or one that etched at nearly the same rate as the surface material to be planarized) is deposited on the surface in a non-conformal manner so that its surface is flat. As this material is etched, the oxide as well as the surface material is reduced in thickness until the desired planar depth is reached. This technique, as well as others, are known to those skilled in the art.

Figure 7A:
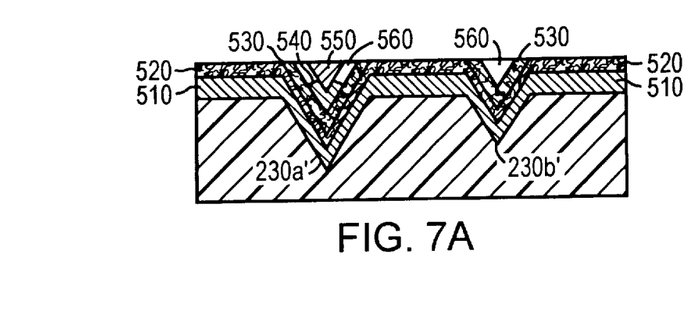
FIG. 7A is a sectional view of the substrate shown in FIG. 2A taken along line 2B—2B, post metal etching.
Figure 7B:
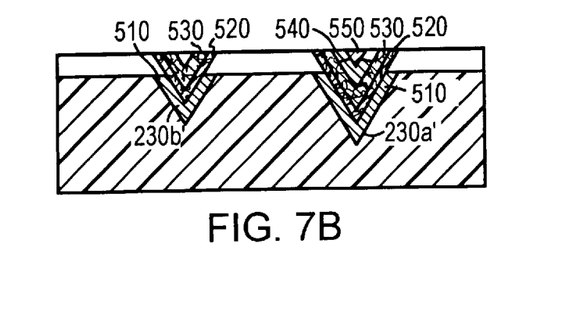
FIG. 7B is a sectional view of the substrate shown in FIG. 2A taken along line 2C—2C, post metal etching.

The timed metal etch (step 320) removes any of the exposed metal layers 540 and 510 not protected by remaining barrier layer 550 or the silicon layers 520 and 530, as depicted in FIGS. 7A and 7B. As a result, recesses 560 are formed within pits 230a' and 230b'. Additionally, metal layers 540 and 510 exposed within columns 220 are removed, thereby isolating the conductive rows 210.

Figure 8A:
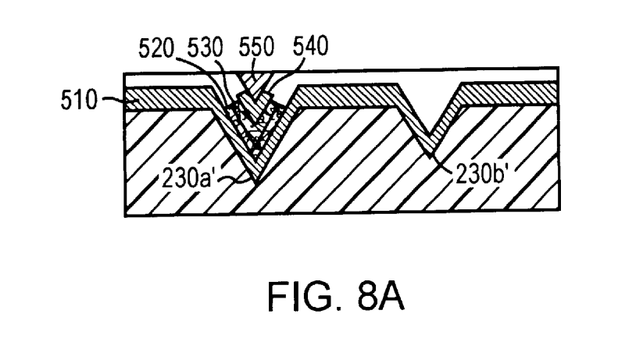
FIG. 8A is a sectional view of the substrate shown in FIG. 2A taken along line 2B—2B, after silicon etching.
Figure 8B:
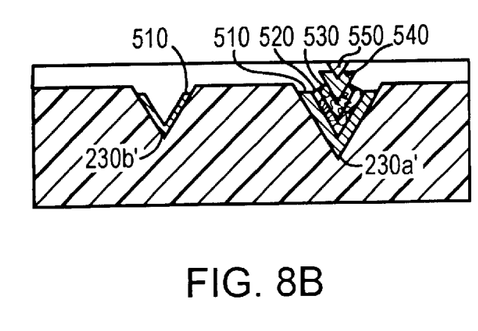
FIG. 8B is a sectional view of the substrate shown in FIG. 2A taken along line 2C—2C, after silicon etching.

Next, the timed silicon etch (step 330) removes any exposed silicon of silicon layers 530 and 520. As shown in FIGS. 8A and 8B, the only remaining silicon resides in larger pits 230a'. As stated above, the larger pits 230a' define where the rows 210 and columns 220 cross to form nonlinear elements. Larger pits 230a' each retain a layer of $N^+$amorphous silicon 520 and a layer of amorphous silicon 530 cooperating to form diodes (e.g., Schottky diodes). The $N^+$ doped layer 520 forms an ohmic contact with the lower metal layer 510 in the rows 210 and the undoped amorphous silicon layer 530 forms a Schottky barrier with the top metal layer 540, which becomes connected to the columns 220 as described below.

Figure 9A:
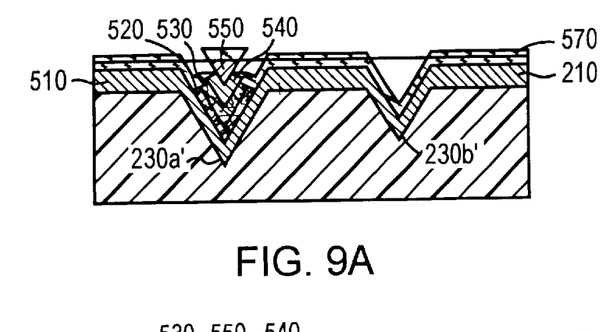
FIG. 9A is a sectional view of the substrate shown in FIG. 2A taken along line 2B—2B, after an insulation layer is applied.
Figure 9B:
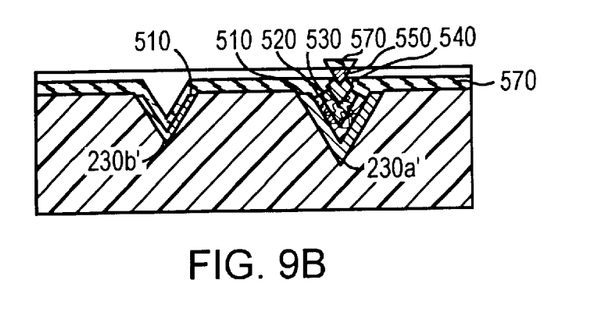
FIG. 9B is a sectional view of the substrate shown in FIG. 2A taken along line 2C—2C, after an insulation layer is applied.
Figure 10A:
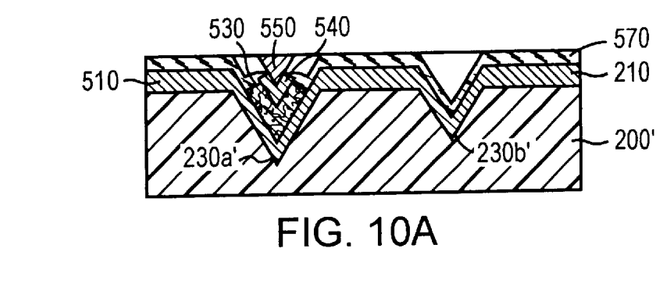
FIG. 10A is a sectional view of the substrate shown in FIG. 2A taken along line 2B—2B, after planarization.
Figure 10B:
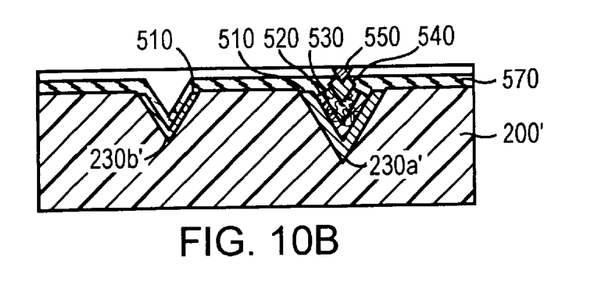
FIG. 10B is a sectional view of the substrate shown in FIG. 2A taken along line 2C—2C, after planarization.
Figure 11A:
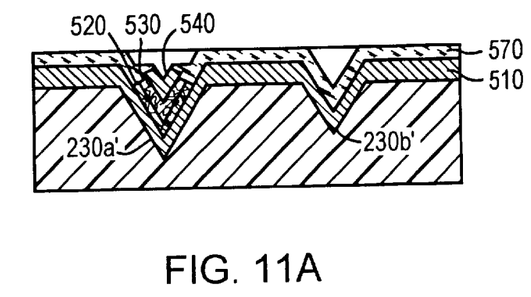
FIG. 11A is a sectional view of the substrate shown in FIG. 2A taken along line 2B—2B, after the barrier layer is removed by etching.
Figure 11B:
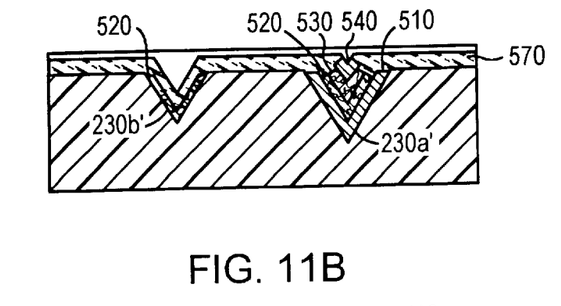
FIG. 11B is a side view along line 2C of FIG. 2A showing an embodiment of the after the barrier layer is removed by etching.

Deposition of an insulation layer (step 340) (e.g., silicon dioxide) by a conventional process such as plasma enhanced chemical vapor deposition (PECVD) or sputtering results in the structure shown in FIGS. 9A and 9B. The pyramidal shape of pits 230' result in barrier layer 550 not being entirely covered (because the insulator material does not easily get underneath barrier layer 550). If the pits 230 have straight (vertical) walls rather than angled walls, or if the deposition runs somewhat more conformally, the sides of the barrier material might be coated with a very thin layer of insulator material. This would then be corrected by removing it with a quick etch dip timed to remove this side wall coating without significantly reducing the bulk of this deposited layer. Insulation layer 570 extending above substrate 200' is planarized back to the level of substrate 200'. FIG. 10A and FIG. 10B show the non-insulated barrier layers 550 exposed within larger pits 230a'. Etching away the exposed barrier layer 550 (step 360) exposes the top metal layer 540 in deep pits 230a' as shown in FIGS. 11A and 11B. Alternatively, this polishing step could be omitted and the barrier just etched away which will also remove the insulator material from above the barrier material as is commonly done in a liftoff process. Following the removal of the barrier material, the metal on top of the silicon material in the deeper pits 230a' (i.e., those in which it is desired to form a nonlinear element) is exposed.

Figure 12A:
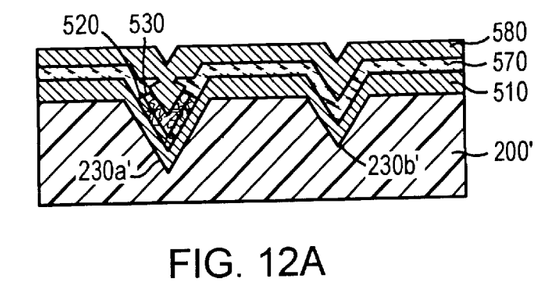
FIG. 12A is a sectional view of the substrate shown in FIG. 2A taken along line 2B—2B, after metal deposition.
Figure 12B:
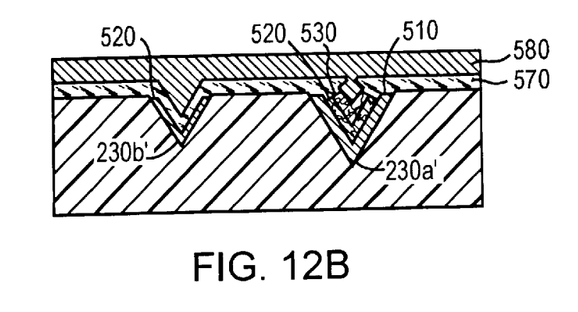
FIG. 12B is a sectional view of the substrate shown in FIG. 2A taken along line 2C—2C, after metal deposition.
Figure 13A:
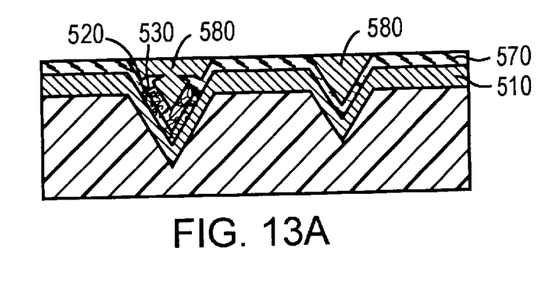
FIG. 13A is a sectional view of the substrate shown in FIG. 2A taken along line 2B—2B, after planarization.
Figure 13B:
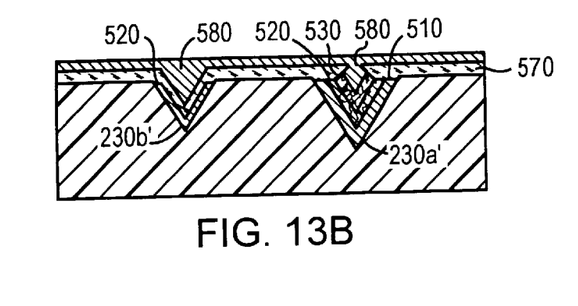
FIG. 13B is a sectional view of the substrate shown in FIG. 2A taken along line 2C—2C, after planarization.

A final metal layer 580 is deposited (step 370) on top of insulation layer 570. A portion of the final metal layer 580 extends above substrate 200' as depicted in FIGS. 12A and 12B. That portion is planarized back to the level of substrate 200'. The resulting conductive metal rows 210 and columns 220 can now be recognized, and the microelectronic circuit is shown in FIGS. 13A and 13B. With the addition of a material layer suitable for forming a programmable conducting path such as a fusible link, an anti-fusible link, a resistively alterable material (e.g., a phase change material), or the like, an array of diodes constructed according to the present invention and U.S. Pat. No. 5,673,218, the entire contents of which are herein incorporated by reference, could be made into a one-time or multiple-time programmable memory. In this variation, all of the storage locations would be identically formed with an electrical path from top metal layer to the bottom metal layer (i.e., all would be formed using the deepest pit).

The substrate features are shown here as having been formed with the KOH etch as described above but could have been formed with a series of RIE etches (in which case the features would have a more squared-off shape) or chemical etches (in which the features would have a more inverted mushroom-cap shape) that are timed to control the depth of the etch. Squared-off or mushroom-cap features could be used just as well because it is the depth of the pits and the width at the surface (not their width at the bottom) that is the critical factor for constructing devices according to the present invention. It should be noted that for continuity of traces from one depth feature to an adjacent different depth feature where the etch has produced vertical side walls, a conformal deposition should be used to ensure that a connection is made between the bottom of one feature and up the side wall to the bottom of an adjacent feature.

Figure 14:
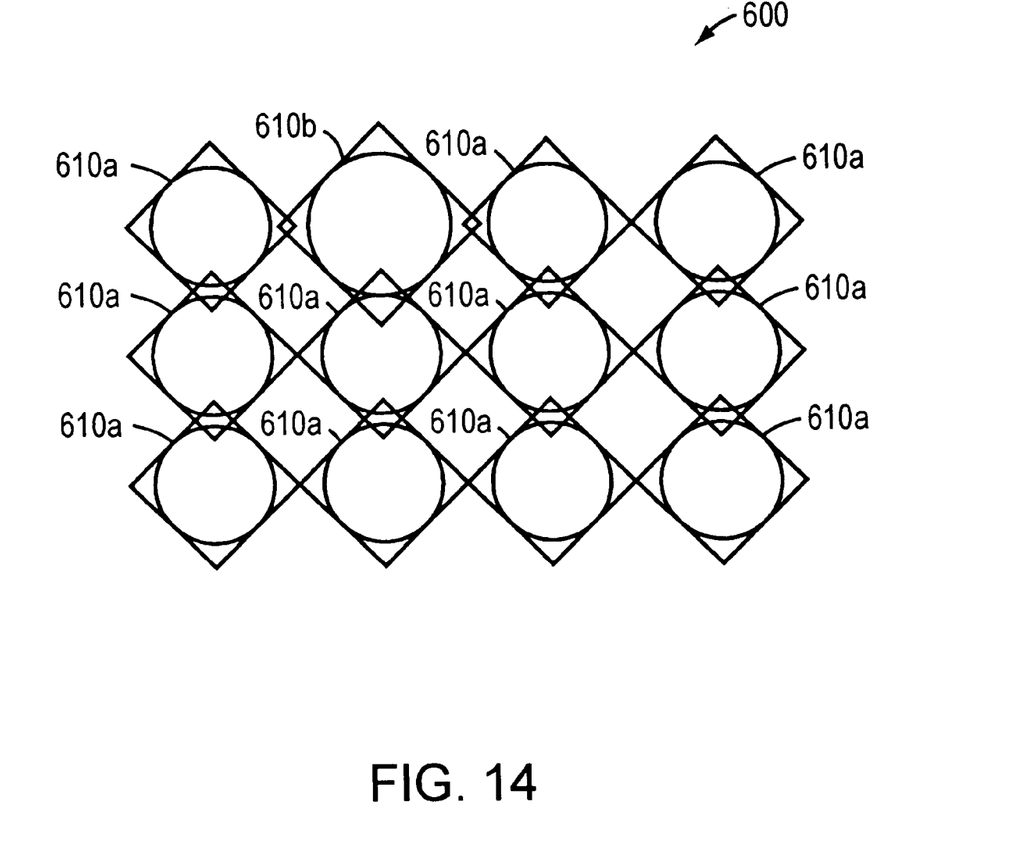
FIG. 14 illustrates a representative embodiment of a mask.

Another technique for forming the substrate features is shown in FIG. 14. With this approach, an etch mask 600 is created that includes a feature 610a or 610b (referred to generally as 610) for each of the pits 230 but not the channels connecting the pits 230. These mask features 610 can be formed in one of two sizes corresponding to the two different pit depths. FIG. 14 shows the features 610 having a circular form; however, a mask could be created in which the features 610 have a square form oriented at a 45° angle to the resulting etched pits (i.e., a square-oriented mask opening within diamond-oriented pits). The orientation of the rows and columns of the mask are turned 45° to the <111> silicon crystal orientation. As shown in FIG. 14, a KOH etch will undercut the mask shape to find the pyramidal etch stop, except that this undercut will merge with the corners of the adjacent features and form the channels between the pits. The larger features 610b will result in deeper pits while the smaller features 610a will result in shallower pits. The features 610 that are closer (i.e., the circles forming the rows) will have deeper channels while the more widely spaced features (i.e., the circles forming the columns) will have shallower channels. The circle sizes and spacing are selected such that any two adjacent circles, whether they are both large or small or one of each size, result in a channel depth that causes retention only of the appropriate remaining material layers in the channel between them. With this approach, the pit depths are controlled by the natural etch stop while the channel depths are controlled by timing the etch. To help ensure the depths of the pits are fully achieved by the time the channels have formed, an initial RIE etch, as described above, may be performed. If the substrate is generated by e-beam lithography, the two mask feature sizes can be selected by varying the power of the e-beam whereby a large circle feature would be drawn with a higher e-beam power than a smaller circle feature. Characterization of a focus-exposure test will determine the appropriate power levels for the two feature sizes.

The present invention is based on the approach that layers deposited on a contoured substrate can be processed through planarizations and etches such that the material left behind forms a circuit in which the feature are self-aligning. The different height of the surface prior to material deposition determines which materials are exposed at any given point on the surface following planarization. The exposed surfaces can be further selectively processed through etching. Pits having several different widths and depths can be envisioned whereby the process can be repeated to produce pits comprising multiple layers of material enabling the formation of more complex devices. For example, with the addition of a thin dielectric layer, a TFT-like transistor could be incorporated.

The present invention can include other process steps. For example, where there is a metal area formed in the bottom of a feature that is to become a bonding pad, it may be desirable to deposit the top metal on the surface without the insulating material 570 and semiconducting materials 520 and 530 in series with that bottom metal and top metal. To accomplish this, a shadow mask can be used to block the deposition of the insulating and semiconducting materials in the area of the bonding pad. The top metal will now make a direct connection to the bottom metal in this area. This shadow masking can be accomplished because a bonding pad feature can have an area of 50 $\mu$m to 200 $\mu$m or more, thereby making alignment of the mask to the substrate possible without advanced lithography and alignment tools. Other shadow mask steps may be used to fabricate an array of field effect transistors (FETs) placed together in an area of the substrate such that a thin oxide or some other dielectric can be deposited upon the gate regions without having that material be deposited upon other areas of the substrate. Alternatively, low-resolution photolithography can be used (instead of a shadow mask) followed by a liftoff.

Having shown the preferred embodiments, one skilled in the art will realize that many variations are possible within the scope and spirit of the claimed invention. It is therefore the intention to limit the invention only by the scope of the claims.

What is claimed is:

1. A method of fabricating an electronic device, the method comprising the steps of:
   a. fabricating a form having a raised topology complementary to a desired pattern of pits and channels;
   b. applying the form to a moldable material to impose the pattern therein; and
   c. applying to the patterned material a series of layers having desired electrical properties to create the electronic device.

2. The method of claim 1 wherein the form is fabricated according to steps comprising:
   a. providing an etchable master substrate;
   b. etching the pattern into the master substrate; and
   c. forming a topology complementary to the pattern to serve as the form.

3. The method of claim 1 wherein the pattern is imposed on the substrate by injection molding.

4. The method of claim 1 wherein the pits are pyramidal pits and the channels are V-grooves.

5. The method of claim 1 wherein the layers form a matrix of nonlinear elements.

6. The method of claim 1 wherein the channels include a first series of channels running in a first direction and a second series of channels running in a second direction substantially perpendicular to the first direction, wherein:
   a. the first-series channels and the second-series channels cross at crossing points;
   b. the pits are located at the crossing points;
   c. the layers form nonlinear elements in at least some of the pits, the nonlinear elements each connecting a first-series channel with a second-series channel.

7. The method of claim 6 wherein the electronic device is a memory circuit having data contents, the nonlinear elements being distributed among the pits in a scheme defining the data contents.

8. The method of claim 6 wherein the electronic device is a memory circuit having data contents, the nonlinear elements being selectively enabled in a scheme defining the data contents.

9. The method of claim 7 wherein the nonlinear elements are diodes.

10. The method of claim 7 wherein the pits have sizes, the size of a pit determining whether a nonlinear element is formed at the crossing point of the pit.

11. The method of claim 1 wherein the material is insulative.

12. A method of fabricating a memory device having data contents, the method comprising the steps of:
   a. defining a pattern of pits and channels on a substrate, the channels including a first series of channels running in a first direction and a second series of channels running in a second direction substantially perpendicular to the first direction, wherein (i) the first-series channels and the second-series channels cross at crossing points, and (ii) the pits are located at the crossing points; and b. forming nonlinear elements in at least some of the pits.

13. The method of claim 12 wherein the nonlinear elements each connect a first-series channel with a second-series channel and are distributed among the pits in a scheme defining the data contents.

14. The method of claim 12 wherein the nonlinear elements each connect a first-series channel with a second-series channel and are selectively enabled in a scheme defining the data contents.

15. The method of claim 12 wherein the nonlinear elements are diodes.

16. The method of claim 12 wherein the pits have sizes, the size of a pit determining whether a nonlinear element is formed at the crossing point of the pit.

17. The method of claim 12 wherein the substrate is insulative.

18. A method of fabricating a microelectronic device, the method comprising the steps of:

a. defining a pattern on a substrate having a surface, the pattern comprising recesses descending below the surface of the substrate;

b. applying to the patterned substrate a series of layers each having a predetermined electrical property; and c. planarizing following application of at least some of the layers to remove at least some portion of the layers then disposed above the surface of the substrate, the layers cooperating to form an electronic circuit.

19. The method of claim 18 wherein at least some of the planarization steps are accomplished by polishing.

20. The method of claim 18 wherein the pattern comprises a series of pits and channels, the channels including a first series of channels running in a first direction and a second series of channels running in a second direction substantially perpendicular to the first direction, wherein (i) the first-series channels and the second-series channels cross at crossing points, and (ii) the pits are located at the crossing points, the pits having depths determining whether connections are established at the crossing points.

21. A microelectronic device comprising:

a substrate having therein a recessed contour pattern; and a plurality of stacked layers each having a predetermined electrical characteristic, all of the stacked layers being disposed within the contour pattern and some of the layers also residing on the substrate, the layers cooperating to form the electronic device.

22. The microelectronic device of claim 21 wherein the contour pattern further comprises a series of pits and channels, the channels including a first series of channels running in a first direction and a second series of channels running in a second direction substantially perpendicular to the first direction, wherein (i) the first-series channels and the second-series channels cross at crossing points, and (ii) the pits are located at the crossing points.

23. The microelectronic device of claim 22 wherein the pits have depths determining whether a non-linear element is formed from the plurality of stacked layers at the crossing points.

24. The microelectronic device of claim 23 wherein the non-linear element is a diode.

25. The microelectronic device of claim 21 wherein the plurality of stacked layers is planarized to a predetermined height.

26. A product produced in accordance with claim 1.

27. A product produced in accordance with claim 12.

28. A product produced in accordance with claim 18.

29. A method of fabricating a microelectronic device, the method comprising the steps of:

a. defining a pattern on a material having a surface, the pattern comprising recesses descending below the surface of the material;

b. applying to the patterned material a series of layers each having a predetermined electrical property;

c. planarizing following application of at least some of the layers to remove at least some portion of the layers then disposed above the surface of the material, thereby exposing at least one of the layers; and d. etching a portion of at least one exposed layer, the layers thereupon cooperating to form an electronic circuit.

30. The method of claim 29, wherein the planarizing step exposes a plurality of layers, the etching step creating recesses between exposed layers.

31. A method of fabricating a microelectronic device, the method comprising the steps of:

a. defining a pattern on a material having a surface, the pattern comprising recesses descending below the surface of the material to varying depths;

b. applying to the patterned material a series of layers each having a predetermined electrical property; and c. planarizing following application of at least some of the layers to remove at least a portion of the layers then disposed above the surface of the material, the planarization thereby exposing portions of said layers for further processing as a result of the varying recess depths within the patterned material.

* * * * *